United States Patent [19]
Seidel

[11] 3,976,958
[45] Aug. 24, 1976

[54] R-C SIGNAL DIVIDERS AND SIGNAL FILTERS

[75] Inventor: Harold Seidel, Warren, N.J.

[73] Assignee: Bell Telephone Laboratories, Incorporated, Murray Hill, N.J.

[22] Filed: Mar. 27, 1975

[21] Appl. No.: 562,574

[52] U.S. Cl. .................................. 333/6; 328/167; 333/29; 333/70 CR; 333/70 T
[51] Int. Cl.² ..................... H03H 7/06; H03H 7/18; H03H 7/30; H03H 7/48
[58] Field of Search ............ 333/70 T, 70 R, 70 CR, 333/76, 1, 6, 8, 18, 28, 29; 330/69; 328/167

[56] References Cited
UNITED STATES PATENTS

| | | | |
|---|---|---|---|
| 2,085,940 | 7/1937 | Armstrong | 328/155 |
| 2,529,117 | 11/1950 | Tompkins | 333/29 |
| 3,189,820 | 6/1965 | Lowman | 333/70 R X |
| 3,292,110 | 12/1966 | Becker et al. | 333/70 T |
| 3,755,761 | 8/1973 | Hartmann | 333/70 T |

*Primary Examiner*—Alfred E. Smith
*Assistant Examiner*—Marvin Nussbaum
*Attorney, Agent, or Firm*—S. Sherman; R. O. Nimtz

[57] ABSTRACT

A class of signal dividers and signal filters is disclosed comprising first and second wavepaths coupled at one end to a common input port and at their other ends to a summing network to form a sum signal, and to a differencing network to form a differencing signal. Phase shift means are included along at least one wavepath for producing a differential phase shift between signals in said two wavepaths. In order that such devices be capable of operation at very low frequencies (i.e., a few Hertz), be physically small, and be capable of being made by means of integrated circuit techniques, the phase shifters are made solely of R-C passive elements, or of other devices that can be readily integrated.

7 Claims, 11 Drawing Figures

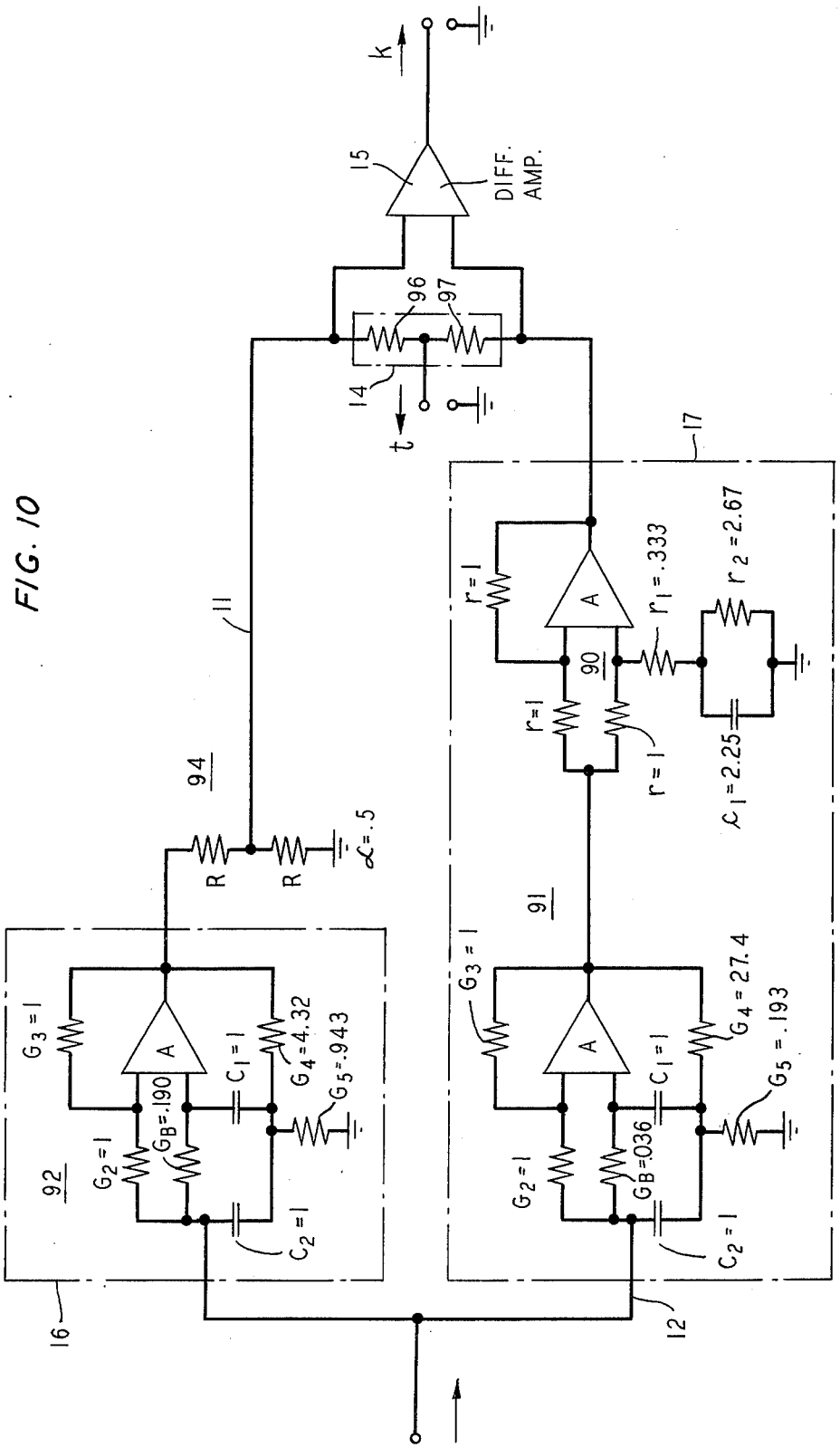

R-C SIGNAL DIVIDERS AND SIGNAL FILTERS

This application relates to signal dividers and signal filters.

BACKGROUND OF THE INVENTION

Typically, signal dividers and signal filters are made solely of reactive elements so as to minimize losses. For example, the quadrature coupler, one of the more useful kinds of signal dividers, is made of either lengths of transmission lines, or of discrete inductors and capacitors. At the higher frequencies, such quadrature couplers can be readily fabricated in very small, convenient packages. However, at the lower frequencies, i.e., a few Hertz, the size of the reactive components becomes prohibitive. In addition, large inductors and capacitors cannot be easily fabricated by means of integrated circuit techniques.

It is, accordingly, a broad object of the present invention to synthesize signal dividers and signal filters that are capable of operation at very low signal frequencies, are physically small, and are capable of being made by means of integrated circuit techniques.

SUMMARY OF THE INVENTION

Signal dividers and signal filters, in accordance with the present invention, comprise a pair of wavepaths connectd to a common inut port at one end, and to a summing network, and to a differencing network at their other ends. Included in the two wavepaths are phase shifters for producing a differential phase shift between signals propagating therealong.

Because the output signals derived from the sum and difference networks are 90° out of phase, such circuits are similar to quadrature couplers. However, as they lack other of the characteristics of a true coupler, they are, more accurately, pseudo-quadrature couplers.

In one illustrative embodiment, the phase shifters include only resistors and capacitors. Any loss resulting from the use of resistors can be compensated for by means of separate attenuators and/or amplifiers located in the sum and difference circuits, or in the respective wavepaths.

In an alternative illustrative embodiment of the invention, the phase shifters include resistors, capacitors and solid-state operational amplifiers.

In a third illustrative embodiment transversal equalizers are used as phase shifters.

As will be explained in greater detail hereinbelow, a signal divider can be made to have any arbitrary signal division ratio as a function of frequency. As such, it can serve as a filter having an arbitrary transfer response, including a polynomial having zeros and poles. Using conventional filter synthesis, a transmission null is typically produced by means of a parallel resonator placed in series with the wavepath, or a series resonator placed in shunt across the wavepath. These serve as open circuits or short circuits, respectively, at the frequency to which they are tuned. The depths of the null that is produced, however, depend upon the Q of the reactive elements. An infinite null requires nonexistent infinite Q elements. Active filters have a general one-to-one correspondence to passive reactive filters and, hence, similar problems and limitations exist.

A principal advantage of the present invention is that a null is produced by means of an interference process. As such, it does not require that the wavepaths be lossless but only that they have equal loss (or gain) at the 180° differential phase condition.

It is another advantage of the present invention that it can be readily made to operate at very low frequencies.

It is a further advantage of the invention that it can be fabricated by means of integrated circuit techniques.

BRIEF DESCRIPTION OF THE DRAWINGS

FIG. 10 shows a specific embodiment of a channel-dropping filter in accordance with the teachings of the invention.

DETAILED DESCRIPTION

Figure 1:
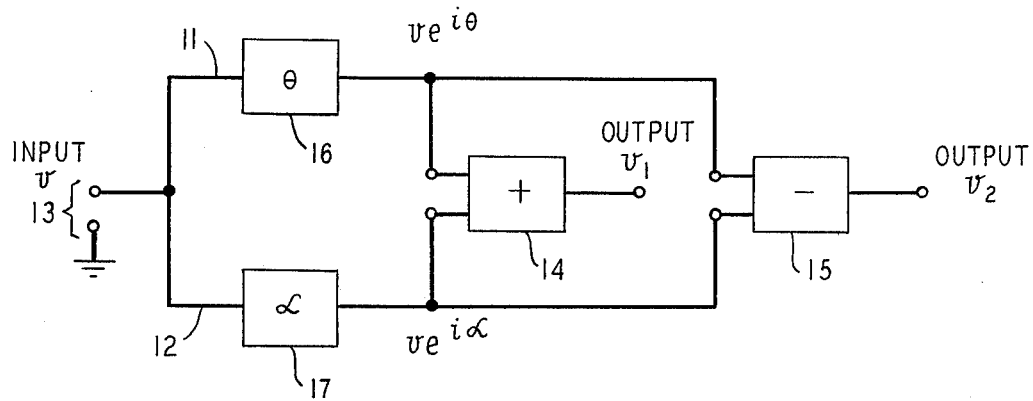
FIG. 1 shows, in block diagram, a coupler in accordance with the present invention.

Referring to the drawings, FIG. 1 shows, in block diagram, a signal divider 10 in accordance with the present invention. The divider comprises a pair of wavepaths 11 and 12 conncted at their input ends to a common input port 13, and at their output ends to a summing network 14 and a differencing network 15. Each of he wavepaths includes a phase shifter for producing a net differential phase shift between the signals propagating therethrough. Thus, a first phase shifter 16, for producing a phase shift $\Theta$, is shown included in wavepath 11, and a second phase shifter 17, for producing a phase shift $\alpha$, is shown included in wavepath 12, where $\Theta$ and $\alpha$ are functions of frequency. It will be appreciated, however, that either one of the phase shifters can be omitted, which would represent the case in which the phase shift in one of the two wavepaths is zero.

In operation, an input signal $v$ applied to port 13 results in a signal $ve^{i\Theta}$ at the output end of wavepath 11, and a signal $ve^{i\alpha}$ at the output end of wavepath 12. Applied to summing network 14 and differencing network 15, these two signals produce in the summing network a first output signal component $v_1$ given by $$v_1 = v(e^{i\Theta} + e^{i\alpha}) \qquad (1)$$

and a second output signal component $v_2$ in the differencing network given by $$v_2 = v(e^{i\Theta} - e^{i\alpha}). \qquad (2)$$

Equations (1) and (2) can be shown, by trigonometric transformation, to reduce to $$v_1 = v \cos \frac{(\theta-\alpha)}{2} \epsilon^{i\frac{(\alpha+\theta)}{2}} \quad (3)$$

and $$v_2 = iv \sin \frac{(\theta-\alpha)}{2} \epsilon^{i\frac{(\alpha+\theta)}{2}}, \quad (4)$$

which states that (a) the magnitudes of the two output signals are proportional, respectively, to the cosine and the sine of one-half the differential phase shift produced in the two wavepaths, and (b) the two output signals are 90° out of phase. If, to within a common phasor $$\epsilon^{i\frac{(\theta+\alpha)}{2}},$$

we let $$\cos\left(\frac{\theta-\alpha}{2}\right) = t \quad (5)$$

and $$i \sin\left(\frac{\theta-\alpha}{2}\right) = ik, \quad (6)$$

the circuit can then be characterized by a coefficient of transmission $t$ and a coefficient of coupling $k$, where $$|t|^2 + |ik|^2 = 1, \quad (7)$$

as in a quadrature coupler. However, since the circuit of FIG. 1 is a three-port rather than a four-port, and for other reasons, the circuit is not a true quadrture coupler.

As indicated above, a true quadrature coupler is a purely reactive device. However, the size of such devices becomes impractical at very low frequencies. Furthermore, large inductive elements cannot be easily fabricated using integrated circuit techniques. Accordingly, it is an object of the present invention to realize the circuit of FIG. 1 using only resistive and capacitive passive circuit elements, and transistors, all of which are readily integrable.

Figure 2:
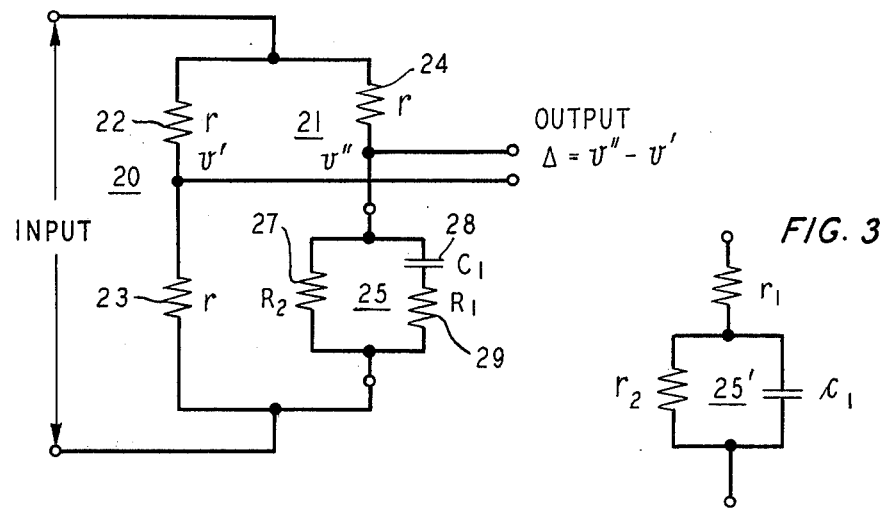
FIGS. 2 and 3 show a first embodiment of an R-C phase shifter that can be used to practice the invention, and a modification thereof.

FIG. 2, now to be considered, shows one embodiment of an R-C phase shifter that can be used in the circuit of FIG. 1. The phase shifter includes a pair of parallel-connected branches 20 and 21. Branch 20 comprises a pair of series-connected resistors 22 and 23 of equal magnitude $r$. The other branch 21 comprises a resistor 24, of magnitude $r$, connected in series with an R-C circuit 25. The latter includes a resistor 27, of magnitude $R_2$, connected in parallel with the series-connected combination of a capacitor 28, of magnitude $C_1$, and a resistor 29 of magnitude $R_1$.

When a signal $y$ is applied across this phase shifter, a voltage $v'$ is produced at the junction of resistors 22 and 23 that is given by $$v' = v/2. \quad (8)$$

A voltage $v''$, appearing at the junction of resistor 24 and circuit 25, is given by $$v'' = v\left[\frac{Z}{(Z+r)}\right], \quad (9)$$

where $Z$ is the equivalent impedance of circuit 25.

The voltage difference $\Delta$ between $v''$ and $v'$ is, therefore, $$\Delta = v\left[\frac{Z}{(Z+r)} - \frac{1}{2}\right], \quad (10)$$

or $$\Delta = \frac{v(Z-r)}{2(Z+r)} = \frac{v}{2}\Gamma \underline{|\beta.} \quad (11)$$

Equation (11) states that the voltage difference betwen voltage $v''$ and $v'$ is proportional to the reflection coefficient $\Gamma \underline{|\beta}$ of circuit 25 relative to a reference impedance $r$.

What we would like in a phase shifter is an all-pass network whose output voltage remains constant, but whose phase angle changes as a function of frequency to accommodate a particular desired frequency response. It should be appreciated, by the way, that for a frequency response characterized by poles, the phase angle variations as a function of frequency must necessarily be nonlinear, as they are in fact in the circuit of FIG. 2. Substituting $R_1$, $C_1$ and $R_2$ for $Z$, we find that this condition obtains for the phase shifter of FIG. 2 when the magnitude of the zero frequency impedance of circuit 25 relative to $r$ *is equal to the magnitude of the conductance of circuit 25 at infinite frequence relative to* $1/r$. Since, at zero frequency, the relative impedance of circuit 25 in $R_2/r$. and an infinite frequency the relative conductance is $$\left(\frac{1}{R_1} + \frac{1}{R_2}\right)r,$$

the condition is satisfied when $$r\left(\frac{1}{R_1} + \frac{1}{R_2}\right) = R_2/r \quad (12)$$

or $$R_1 = \frac{R_2 r^2}{(R_2^2 - r^2)}. \quad (13)$$

The magnitude of the capacitor for producing a 90° phase shift at a specified frequency $\omega$ is given by $$C_1 = \frac{(R_2 + r)}{\omega[R_1 R_2 + r(R_1 + R_2)]}. \quad (14)$$

Figure 3:
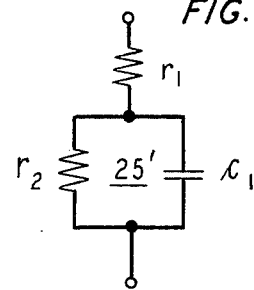

FIG. 3 shows an alternate circuit configuration 25' of circuit 25 comprising a resistor $r_1$ in series with the parallel combination of a resistor $r_2$ and a capacitor $c_1$.

The magnitudes of the respective components are given in terms of $R_1$, $R_2$ and $C$ by $$r_1 = \frac{R_1 R_2}{(R_1 + R_2)}, \quad (15)$$

$$r_2 = \frac{R_2^2}{(R_1 + R_2)}. \quad (16)$$

and $$c_1 = \frac{(R_1 + R_2)^2 C_1}{R_2^2}. \quad (17)$$

Figure 4:
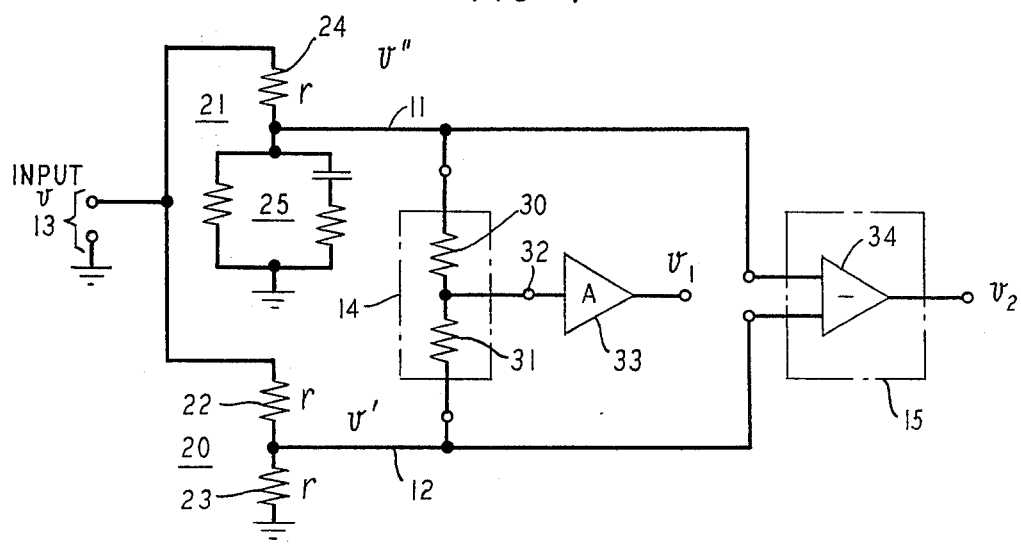
FIG. 4 shows a first illustrative embodiment of a coupler using the phase shifter of FIG. 2.

FIG. 4 shows, in greater detail, a first illustrative embodiment of a coupler circuit incorporating the phase shifter of FIG. 2. Using the same identification numerals as were used in FIGS. 1 and 2 to identify corresponding components, the coupler includes a differential phase shifter comprising the two parallel-connected branches 20 and 21 which are connected between the common input port 13 and ground. The junction of resistors 22 and 23 of branch 20 is connected to one of the input ports of summing network 14 and one of the input ports of differencing network 15. The other input port of each of the networks 14 and 15 is connected to the junction of resistor 24 and circuit 25 of branch 21.

In this embodiment, the summing network comprises a pair of resistors 30 and 31 which connect wavepaths 11 and 12, respectively, to a common output junction 32. An amplifier 33 is optionally connected to output junction 32.

The differencing network 15 comprises a differential amplifier 34.

In operation, an input voltage $v$, applied to input port 13 produces voltages $v'$ and $v''$ across the summing and differencing networks 14 and 15. The resulting output voltages $v_1$ and $v_2$ are then proportional to the sine and cosine of the angle $\beta$ of the reflection coefficient $\Gamma$ given by equation (11). The absolute magnitude of $v_1$ and $v_2$ will depend upon the loss through the differential phase shifter and the gain of amplifier 33 and differential amplifier 34.

Figure 5:
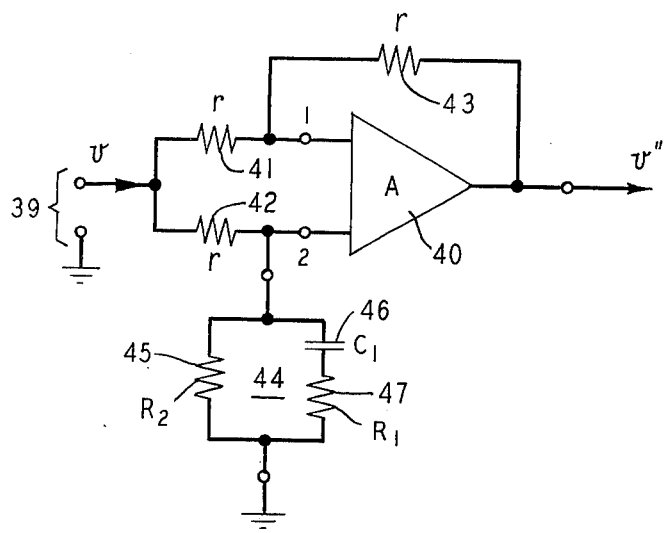
FIGS. 5 and 6 show a second embodiment of a phase shifter and a modification thereof.

FIG. 5 illustrates the use of an operational amplifier as a phase shifter. The latter comprises a differential amplifier 40 whose two input terminals 1 and 2 are coupled to a common input port 39 by means of a pair of resistors 41 and 42 of equal magnitude $r$. A third feedback resistor 43, also of magnitude $r$, couples the output end of amplifier 40 to input terminal 1. A circuit 44, comprising a resistor 45, of magnitude $R_2$, connected in parallel with a series-connected capacitor 46 of magnitude $C_1$, and resistor 47 of magnitude $R_1$, is connected in shunt with amplifier input terminal 2.

It can be readily shown that an input voltage $v$ applied to input terminal 39 will produce an output voltage $v''$ given by $$v'' = v \frac{(Z-r)}{(Z+r)} = v \Gamma \lfloor \beta, \quad (18)$$

where $Z$ is the equivalent impedance of circuit 44.

This relationship, it will be noted, is similar to equation (11) and states that the output voltage is proportional to the reflection coefficient $\Gamma \lfloor \beta$ of circuit 44 relative to a reference impedance $r$. To obtain sa constant amplitude output signal whose phase angle $\beta$ is a function of frequency, the criteria set forth in equation (13) for $R_1$ and $R_2$ are established.

Figure 6:
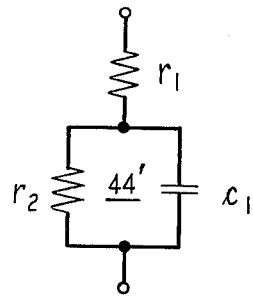

FIG. 6 shows an alternate circuit configuration 44' of circuit 44 comprising a resistor $r_1$ in series with the parallel combination of a resistor $r_2$ and capacitor $c_1$.

The relationships among the various parameters of circuits 44 and 44' are as given by equations (15), (16) and (17).

Figure 7:
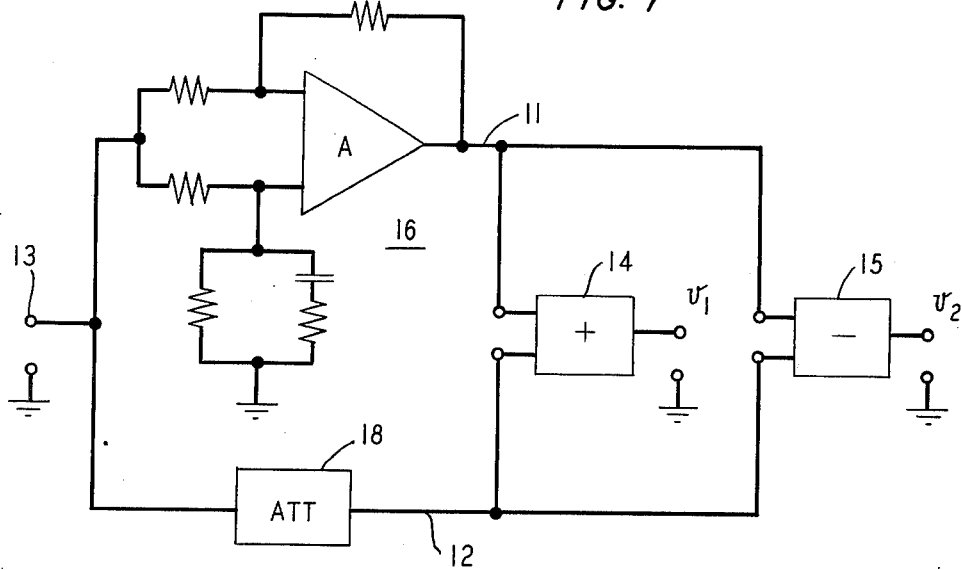
FIG. 7 shows a second illustrative embodiment of the invention using the phase shifter of FIG. 5.

FIG. 7 shows a second embodiment of the invention wherein phase shifter 16 in wavepath 11 of FIG. 1 comprises the operational amplifier of FIG. 5. For purposes of illustration phase shifter 17 in wavepath 12 is omitted, so that in this embodiment $\alpha = 0$. Wavepath 12 and the output from phase shifter 16 are connected to summing network 14 and differencing network 15 to produce the two quadrature output signals $v_1$ and $v_2$ as explained hereinabove. An attenuator 18 is included in wavepath 12 to equalize the losses through the two wavepaths.

Thus far it has been demonstrated that a differential phase shift can be used to divide a signal into two quadrature components $t$ and $k$ whose amplitudes, as a function of frequency, vary as the cosine and sine of the phase difference. In the discussion to follow, a procedure is outlined for synthesizing some arbitrary signal division ratio $k/t$, as a function of frequency.

In general, the procedure includes the following steps:

1. Express the desired signal division ratio $\Gamma(p)$ as a ratio of an odd order polynomial $O(p)$ and an even order polynomial $E(O)$. That is, express $\Gamma(p)$ as either $$\Gamma(p) = \frac{k}{t} = \frac{O(p)}{E(p)} \quad (19)$$

or $$\Gamma(p) = \frac{t}{k} = \frac{E(p)}{O(p)}, \quad (20)$$

where $p = i\omega$ and $\omega$ is the angular frequency.

2. In either case, form the equation $$1 + \Gamma(p) = 0 \quad (21)$$

and solve for $p$, obtaining roots $P_1, P_2, \ldots P_n$. In general, the solution will include both real roots, and conjugate complex pairs of roots.

3. Separate the roots thus obtained into two groups. The first group (a) includes all roots whose real parts are negative. The second group (b) includes all roots whose real parts are positive.

4. For each real root, and for each pair of conjugate complex roots in root group (a), synthesize an all-pass network.

5. Cascade the networks thus synthesized in one of the wavepaths (i.e., 11) to form a first phase shifter (i.e., 16).

6. Form the negative of each real root, and form the negative of each pair of conjugate complex roots in root group (b) and for each synthesize an all-pass network.

7. Cascade the networks thus synthesized in the other wavepath (i.e., 12) to form a second phase shifter (i.e., 17).

8. The ratio of the two signals derived from the summing network (i.e., 14) and the differencing network (i.e., 15), in response to the phase shifts produced by the cascades of all-pass networks, will equal the prescribed signal division ratio $\Gamma(p)$.

EXAMPLE

Figure 8:
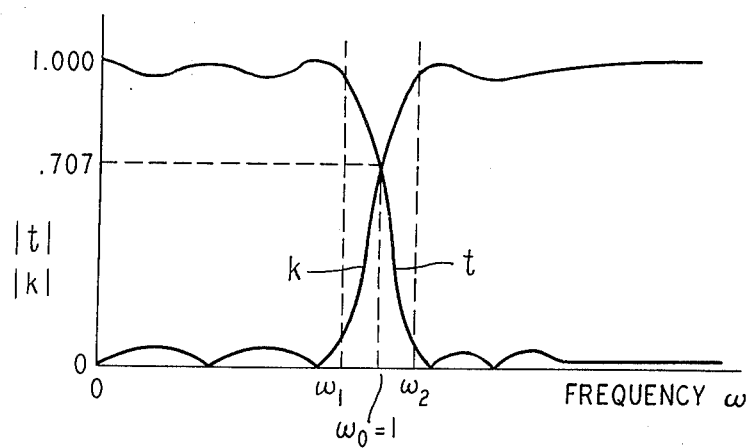
FIG. 8 shows a particular representation of the $t$ and the $k$ functions for producing a filter.

For purposes of illustration, a channel-dropping filter is synthesized employing the procedure outlined hereinabove. A particular representation of the $t$ and the $k$ functions for such a filter are shown in FIG. 8. Over the band of frequencies between zero and $\omega_1$, the transmission coefficient $t$ is essentially maximum, whereas the coupling coefficient $k$ is a minimum. At some specified crossover frequency $\omega_o$ the coefficients are equal to approximately 70 percent of their maximum values. Above frequency $\omega_2$, coefficient $k$ is a maximum and coefficient $t$ is a minimum.

Using conventional ellipic function filter design techniques, in which the number and magnitude of the various ripples are specified, along with the crossover frequency $\omega_o$ and the ratio of $\omega_2$ to $\omega_1$, a ratio function $\Gamma(p)$ can be defined. For the particular case of two equal ripples, of approximately 0.01 dB magnitude, and a ratio of $\omega_2/\omega_1 = 1.3$, the $\Gamma(p)$ function becomes $$\Gamma(p) = \frac{p^5 + 1.068p^3 + 0.2500p}{0.2500p^4 + 1.068p^2 + 1}. \tag{22}$$

Forming the equation $1 + \Gamma(p) = 0$, and solving for $p$ we obtain, in polar form, $$p_1 = -1 \underline{|0°,} \tag{23}$$

$$p_2 = -1 \underline{|\pm 84.46°,} \tag{24}$$

and $$p_3 = -1 \underline{|\pm 118.1°.} \tag{25}$$

It will be noted that the conjugate complex roots represented by root $P_3$ have positive real components and, hence, $P_3$ is a group (b) root, as defined hereinabove. On the other hand, the real root $P_1$, and the pair of conjugate complex roots defined by root $P_2$ have negative components and, hence, $P_1$ and $P_2$ are group (a) roots.

An all-pass network having a real, negative root, $-a$, has a transfer function given by $$T_1(p) = \gamma \frac{-p+a}{p+a}, \tag{26}$$

where $\Gamma$ is a constant. Such a network is realized by circuits of the type illustrated in FIGS. 2 and 5. Letting resistor $r$ in either network equal unity, and using the variation of circuits 25' and 44' given in FIGS. 3 and 6, the values of $r_1$, $r_2$ and $c_1$ are given by $$r_1 = \frac{1-\gamma}{1+\gamma}, \tag{27}$$

$$r_2 = \frac{4\gamma}{1-\gamma^2}, \tag{28}$$

and $$c_1 = \frac{(1+\gamma)^2}{2\gamma a}. \tag{29}$$

Arbitrarily choosing $\gamma = 0.5$ and noting that for $p_1$, $a = 1$, we obtain $$r_1 = 0.333, \tag{30}$$

$$r_2 = 2.667, \tag{31}$$

and $$c_1 = 2.25. \tag{32}$$

Figure 9:
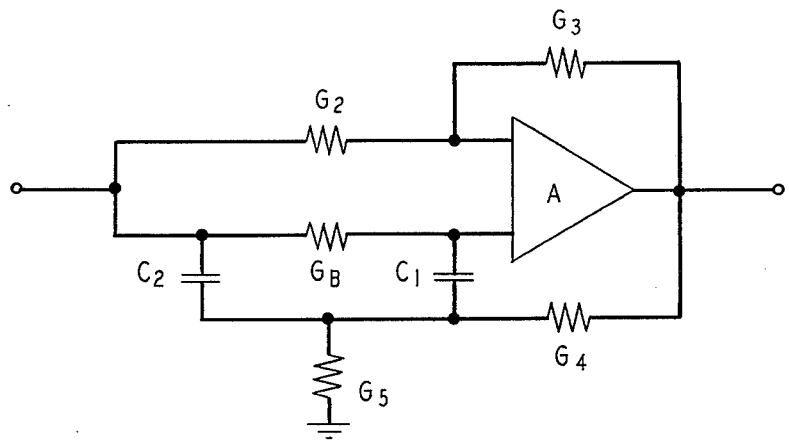
FIG. 9 shows an all-pass network whose transmission function has complex conjugate roots.

An all-pass network having conjugate complex roots is characterized by a transfer function given by $$T_2(p) = \frac{p^2 - d_1 p + d_0}{p^2 + d_1 p + d_0}, \tag{33}$$

where $d_1$ and $d_o$ are constants. Networks of this type are represented by the so-called "Steffen" all-pass circuit described in an article by J. J. Friend et al entitled "STAR: An Active Biquadratic Filter Section," published in the February 1975 issue of the *IEEE Transactions on Circuits and Systems*. One such network is illustrated in FIG. 9.

For roots $p_2$ and $p_3$, $d_1 = 2 \cos \Theta$, where $\Theta$ is the phase angle of the root, and $d_o = 1$. The relative values of the conductances $G_1, G_2 \ldots G_B$, for large values of amplifier gain ($A \to \infty$) and for $C_1 = C_2 = 1$, and $G_2 = G_3 = 1$, are $$G_5 = 2 \cos \Theta, \tag{34}$$

$$G_4 = -2 + \left[4 + \frac{32}{G_5^2}\right]^{1/2}, \tag{35}$$

and $$G_B = \frac{1}{G_4 + G_5}. \tag{36}$$

It should be noted that there are more parameters than independent relationship and, hence, some are arbitrarily chosen, as was done hereinabove.

For root $P_2$, $\Theta = .1°$, and $$G_5 = 0.9430, \tag{37}$$

$$G_4 = 4.324, \tag{38}$$

and $$G_B = 0.1899. \tag{39}$$

For root $P_3$, $\Theta = 84.46°$, and $$G5 = 0.1930, \tag{40}$$

$$G_4 = 27.38, \tag{41}$$

and $$G_B = 0.03627. \tag{42}$$

The complete filter having the signal division ratio specified by equation (22) is shown in FIG. 10 and includes: in wavepath 11, a phase shifter 16 comprising a Steffen all-pass circuit 92 whose transfer characteristic has roots $P_3 = -1 \underline{|\pm 118.1°}$; and in wavepath 12, a phase shifter 17 comprising, in cascade, a Steffen all-pass circuit 91 whose transfer characteristic has roots $P_2 = -1 \underline{|\pm 84.46°}$, and an all-pass network 90 whose transfer characteristic has a root $P_1 = -1 \underline{|0°}$.

Because a $\Gamma = 0.5$ was selected for all-pass circuit 90, an attenuator 94 comprising a pair of equal resistors R is included in wavepath 11 to equalize the transmission loss through the two wavepaths 11 and 12.

The $k$ component is obtained from the output of the differencing network 15, shown in FIG. 10 as a differential amplifier. The $t$ component is obtained from the summing network 14, shown as a pair of resistors 96 and 97 connected in series between wavepaths 11 and 12.

Figure 11:
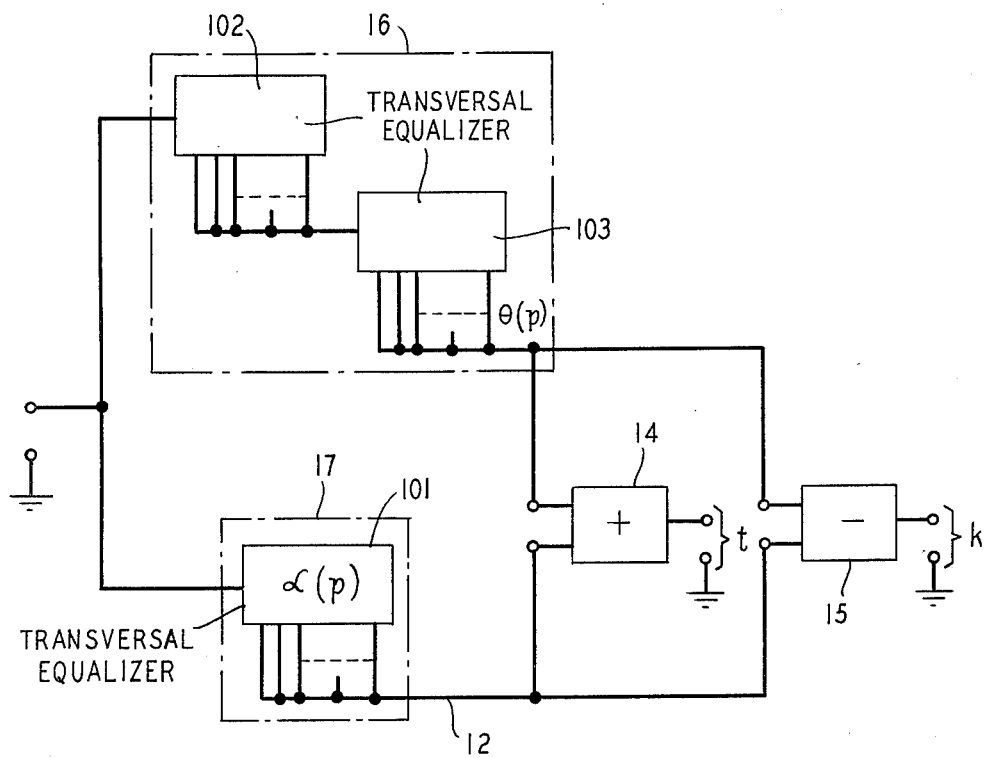
FIG. 11 shows, in block diagram, an embodiment of the invention using transversal equalizers as phase shifter.

It will be recognized that the particular phase shifter shown in the various specific embodiments described hereinabove are merely illustrative, and that other means of obtaining the desired phase shift can just as readily be employed. For example, a transversal equalizer can be used, as is illustrated in FIG. 11. Using the same identification numerals as on FIG. 1 to identify corresponding components, the embodiment of FIG. 11 comprises a pair of wavepaths 11 and 12 connected at one end to a common input port 13, and to a summing network 14 and a differencing network 15 at their other ends. A first phase shifter 16 is located along wavepath 11, and a second phase shifter 17 is located along wavepath 12. Both phase shifters in this embodiment are depicted as transversal equalizers. In particular, one equalizer 101, having a phase shift characteristic $\alpha(p)$, is shown in wavepath 12 whereas a cascade of two equalizers 102 and 103, having a combined phase shift characteristic $\Theta(p)$, are shown in wavepath 11. The equalizers can be any of the well-known integrable types including charge coupled devices, bucket brigade devices and magnetic bubble devices, where the last mentioned may be given appropriate analog character by the use of suitable A-D interfaces.

In all cases it is understood that the above-described arrangements are illustrative of a small number of the many possible specific embodiments which can represent applications of the principles of the invention. Numerous and varied other arrangements can readily be devised in accordance with these principles by those skilled in the art without departing from the spirit and scope of the invention.

What is claimed is:
1. A signal divider comprising:
   first and second wavepaths coupled at one end to a common input port and at their other ends to a summing network to form a sum signal, and to a differencing network to form a difference signal;
   and phase shift means whose passive elements consist of resistive and capacitive elements disposed along at least one of said wavepaths for producing a nonlinear differential phase shift between signals in said two wavepaths.

2. The signal divider according to claim 1 wherein first phase shift means are located in said first wavepath, and second phase shift means are located in said second wavepath.

3. The signal divider according to claim 2 wherein said sum signal is proportional to $\cos(\Theta-\alpha/2)$, and the difference signal is proportional to $\sin(\Theta-\alpha/2)$, where $\Theta$ is the phase shift through said first phase shift means, and $\alpha$ is the phase shift through said second phase shift means.

4. The signal divider according to claim 1 wherein the ratio $\Gamma(p)$ of said sum signal and said difference is given by the ratio of an even order polynomial $E(p)$ and an odd order polynomial $O(p)$, where $p = i\omega$, and $\omega$ is the angular frequency.

5. The signal divider according to claim 4 wherein the roots of the transmission function $T_1(p)$ of said first phase shifter, and the negative of the roots of the transmission function $T_2(p)$ of said second phase shifter constitute all of the roots of the equation $1 + \Gamma(p) = 0$.

6. The signal divider according to claim 1 wherein said phase shift means includes active elements.

7. A signal divider comprising:
   first and second all-pass transversal equalizers having nonlinear phase shift characteristics $\Theta(p)$ and $\alpha(p)$, respectively;
   the input end of each of said equalizers being coupled to a common input port;
   the other output end of each of said equalizers being coupled to a summing network to form a sum signal, and to a differencing network to form a difference signal;
   said sum difference signals constituting the output signals from said divider.

* * * * *